United States Patent
Cook et al.

(10) Patent No.: US 9,177,718 B2
(45) Date of Patent: Nov. 3, 2015

(54) SENSING TRANSFORMER WITH PIVOTABLE AND ROTATABLE SPLIT CORES

(71) Applicant: Veris Industries, LLC, Tualatin, OR (US)

(72) Inventors: Martin Cook, Tigard, OR (US); Mark D. Rowan, Wilsonville, OR (US); Marc Bowman, McMinnville, OR (US); Troy Earl Wecker, Portland, OR (US); Mark Taft, Tualatin, OR (US); Gary Richmond, Tualatin, OR (US); Cristin Rosenbaum, Tualatin, OR (US); Kenneth Courian, Tualatin, OR (US); Doug Porter, Tualatin, OR (US)

(73) Assignee: Veris Industries, LLC, Tualatin, OR (US)

( * ) Notice: Subject to any disclaimer, the term of this patent is extended or adjusted under 35 U.S.C. 154(b) by 0 days.

(21) Appl. No.: 14/466,631

(22) Filed: Aug. 22, 2014

(65) Prior Publication Data
US 2015/0054610 A1   Feb. 26, 2015

Related U.S. Application Data

(60) Provisional application No. 61/869,333, filed on Aug. 23, 2013.

(51) Int. Cl.
*H01F 38/20*   (2006.01)
*H01F 27/02*   (2006.01)
*H01F 27/24*   (2006.01)
*H01F 17/06*   (2006.01)
*H01F 38/30*   (2006.01)
*H01F 27/06*   (2006.01)

(52) U.S. Cl.
CPC ............... *H01F 38/30* (2013.01); *H01F 27/06* (2013.01)

(58) Field of Classification Search
CPC ......... H01F 38/18; H01F 38/30; H01F 38/28; H01F 27/06; H01F 27/02; H01F 27/263; H01F 27/266; H01F 17/06; H01F 17/062; H01F 30/16
USPC .................... 336/132, 212, 173, 175, 176, 90
See application file for complete search history.

(56) References Cited

U.S. PATENT DOCUMENTS

| | | | | |
|---|---|---|---|---|
| 4,258,348 A | * | 3/1981 | Belfer et al. | 336/73 |
| 6,064,192 A | * | 5/2000 | Redmyer | 324/127 |
| 6,794,769 B2 | * | 9/2004 | Black | 307/104 |
| 2009/0115403 A1 | * | 5/2009 | Bernklau | 324/127 |
| 2013/0200971 A1 | * | 8/2013 | Crutcher et al. | 336/90 |

* cited by examiner

*Primary Examiner* — Mangtin Lian
(74) *Attorney, Agent, or Firm* — Chernoff Vilhauer McClung & Stenzel, LLP

(57) ABSTRACT

A split core sensing transformer comprises a first core portion and a second core portion joined to the first core portion for pivoting relative to the first core portion about a first axis and for rotation relative to the first core portion about a second axis substantially normal to said first axis.

10 Claims, 4 Drawing Sheets

SENSING TRANSFORMER WITH PIVOTABLE AND ROTATABLE SPLIT CORES

CROSS-REFERENCE TO RELATED APPLICATIONS

This application claims the benefit of U.S. Provisional App. No. 61/869,333, filed Aug. 23, 2013.

BACKGROUND OF THE INVENTION

The present invention relates to devices for sensing current in a conductor and, more particularly, to a split core current sensing transformer having core portions which may be pivoted and rotated relative to each other.

Allocation of power cost among members of a group of users, protection of circuits from overload and/or monitoring continued operation and/or malfunctioning of a remote circuit or device are just a few exemplary reasons for monitoring the flow of electric current in a conductor. Current monitoring is frequently performed with a sensing or current transformer (CT), typically comprising a coil of wire wrapped around the cross-section of a magnetically permeable core which, in turn, encircles a conductor in which the current is to be measured. An alternating current flowing in the conductor, the primary winding of the transformer, magnetizes the core inducing a current in the coil of wire, the secondary winding, which is substantially proportional to the current in the conductor and the ratio of the number of coils in the transformer's primary winding to the number of coils in the secondary winding.

Sensing transformers may have either a solid core or a split core. A solid core is typically a toroid of magnetically permeable material which encircles the conductor in which the current will be sensed. A disadvantage of a solid core sensing transformer is the requirement that the conductor be disconnected when installing the encircling toroidal core on the conductor. Where the conductor to be monitored has already been connected, a sensing transformer with a split core is often used to facilitate installation. Cota, U.S. Pat. No. 5,502,374, discloses a split core transformer comprising a pair of hinged housing halves each enclosing half of a toroidal transformer core. The transformer can be installed on a conductor by pivoting the free ends of the housing/core portions away from each other; positioning the conductor to be monitored in the center of one of the portions; and closing and latching the core halves around the conductor. Bernklau, U.S. Patent Publication No.: US 2009/0115403, discloses another split core transformer comprising hinged C-shaped or U-shaped transformer core portions. While a hinged split core transformer can be installed without disconnecting the conductor in which the current is to be monitored, sensing transformers are commonly installed in enclosures, such as, a motor starter enclosure, where there is insufficient room to open the hinged portions and maneuver the conductor into position. Bruno, U.S. Pat. No. 7,312,686, discloses a split core current transformer comprising separable core portions. While the disassembled transformer requires no more space than the assembled transformer, it can be difficult to align the core portions when reassembling the core, particularly, in the crowded confines of an enclosure for electrical equipment.

What is desired, therefore, is a split core sensing transformer with hinged core portions which can be conveniently installed in a limited or crowded space.

DETAILED DESCRIPTION OF PREFERRED EMBODIMENTS

Figure 1:
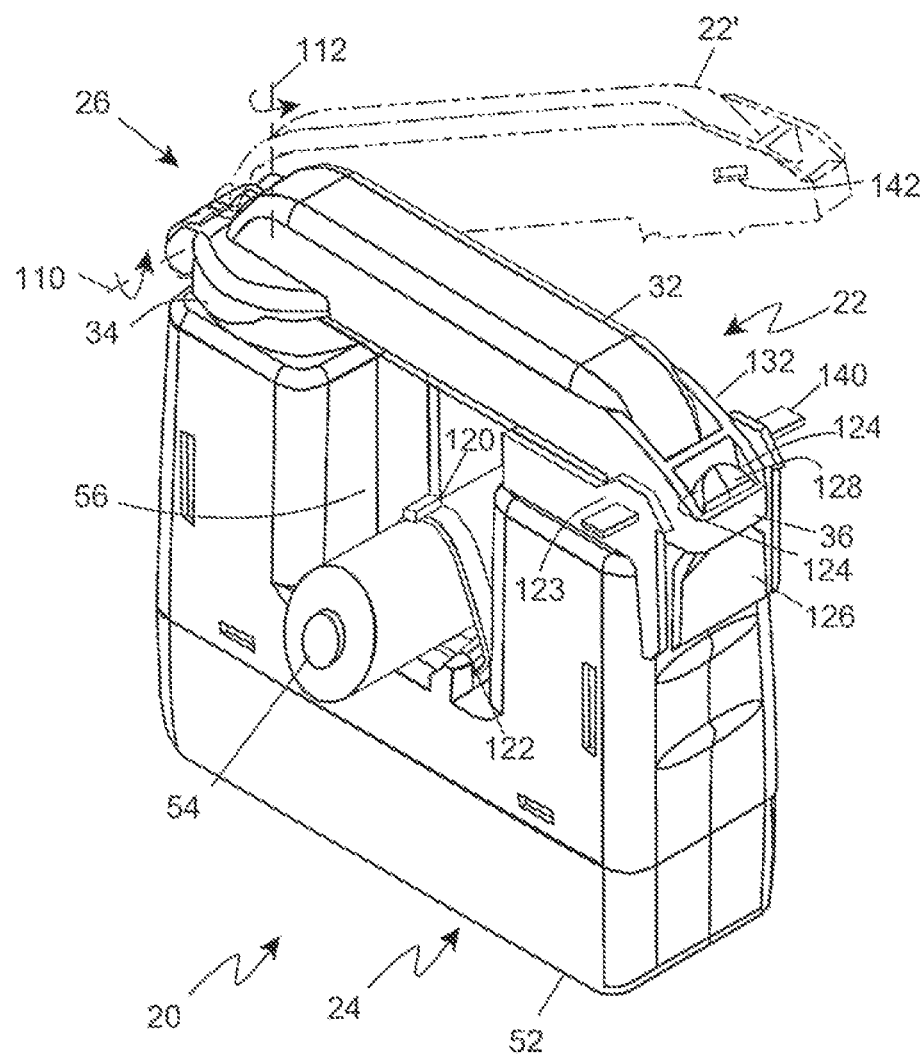
FIG. 1 is an isometric view of a split core sensing transformer having joined core portions which may be rotated relative to each other about two perpendicular axes.
Figure 2:
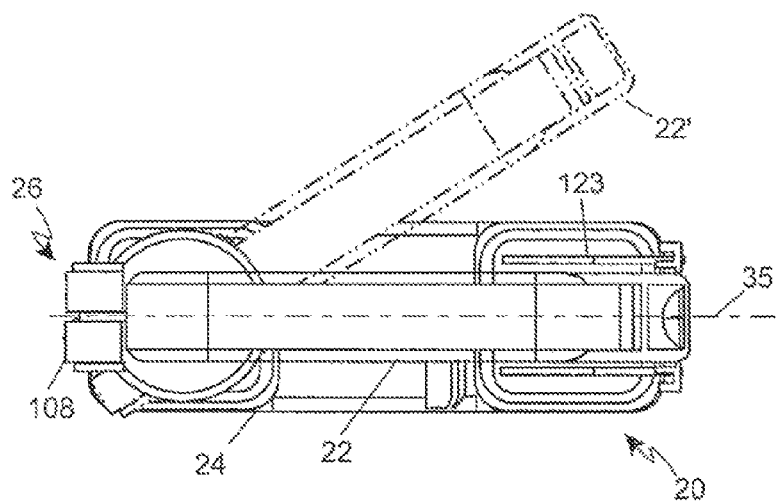
FIG. 2 is a plan view of the sensing transformer of FIG. 1.
Figure 3:
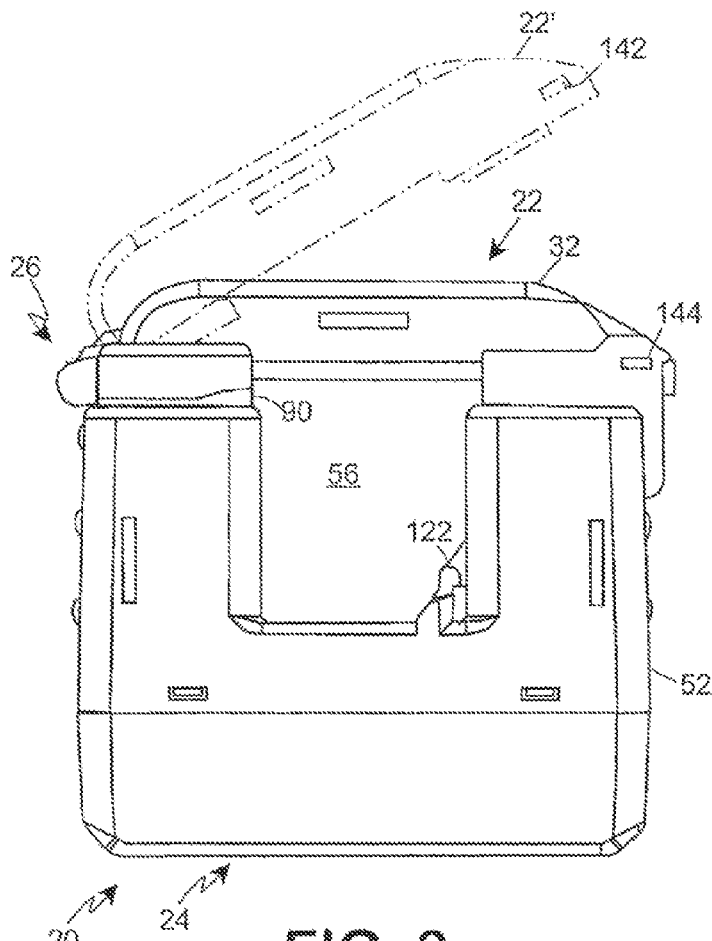
FIG. 3 is a front elevation view of the sensing transformer of FIG. 1.
Figure 4:
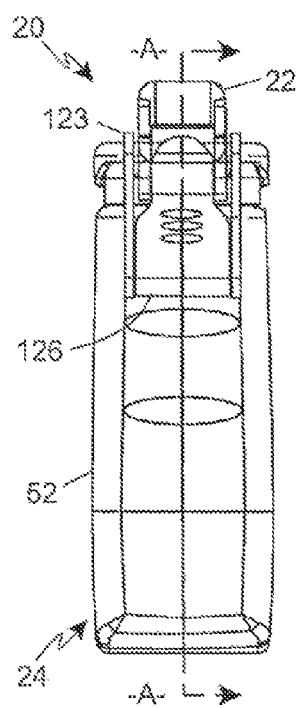
FIG. 4 is a side elevation view of the sensing transformer of FIG. 1.
Figure 5:
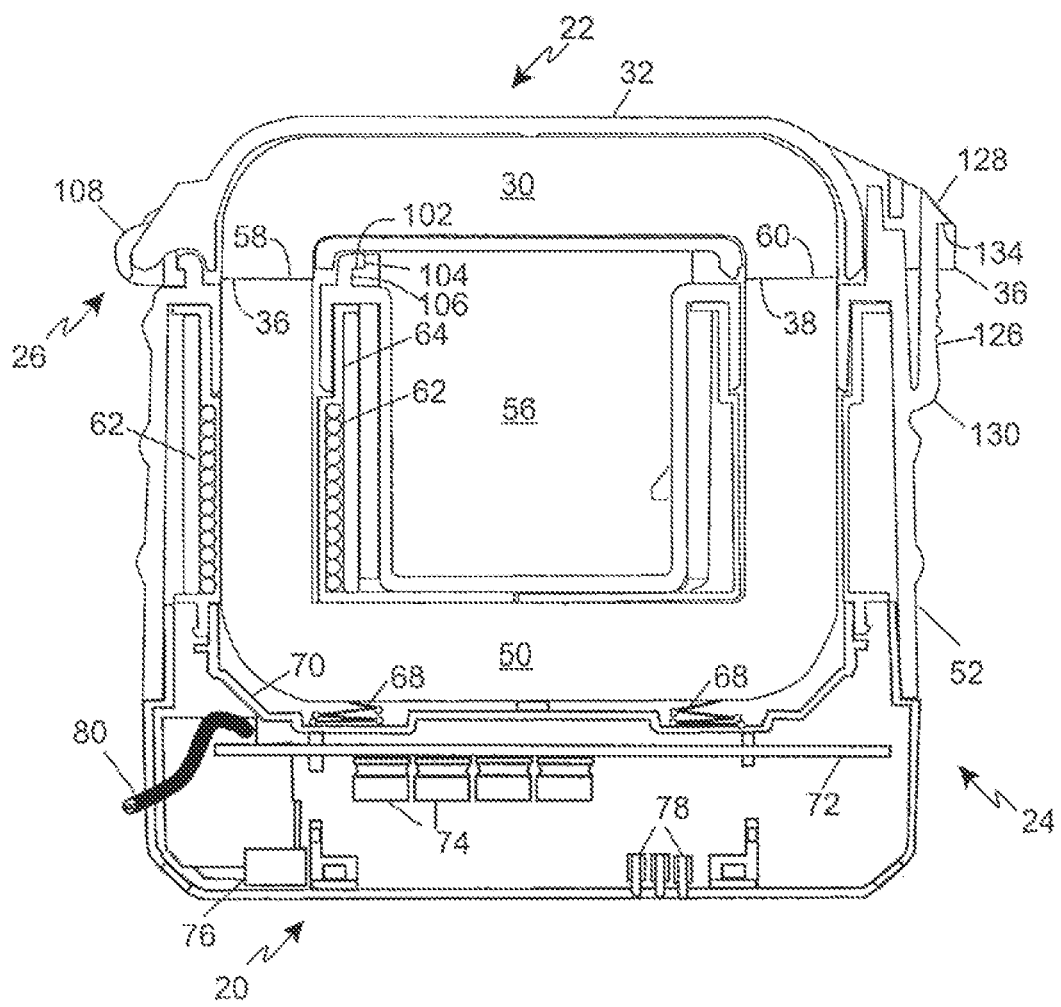
FIG. 5 is a section view of the sensing transformer of FIG. 1 taken along line A-A of FIG. 4.
Figure 6:
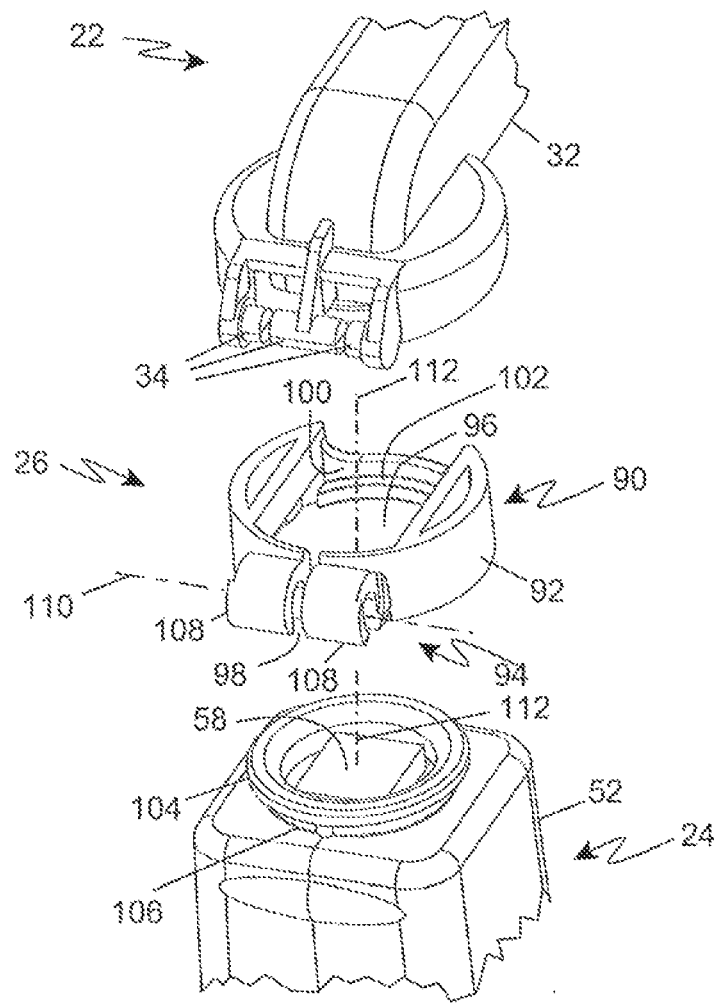
FIG. 6 is an exploded view of a rotatable hinge for the sensing transformer of FIG. 1.
Figure 7:
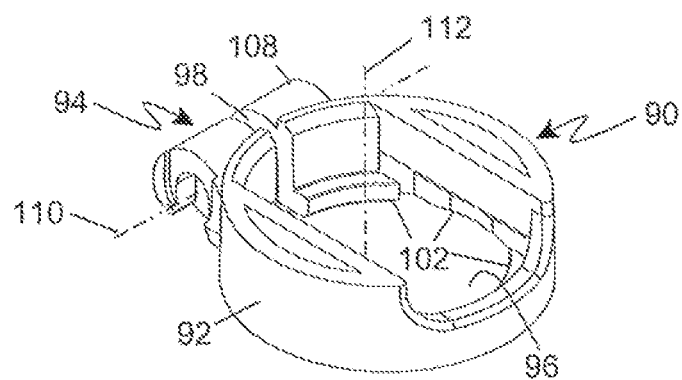
FIG. 7 is an isometric view of a hinge ring of the rotatable hinge of FIG. 6.

Referring in detail to the drawings where similar parts are identified by like reference numerals, and, more particularly to FIGS. 1-7, the split core sensing transformer 20 comprises, generally, a first transformer portion 22, a second transformer portion 24 and a hinge, indicated generally as 26, which joins the first transformer portion to the second transformer portion while enabling relative rotation of the transformer portions about two perpendicular axes.

The first transformer portion 22 includes a first magnetically permeable core portion 30 which is retained in a first core housing 32. The first core portion 30 is U-shaped comprising a base with a leg projecting normal to the base at each end of the base but could be a beam or C-shaped. The first core housing 32 includes portions defining a latch plate element 36 proximate one end of the housing and, proximate the second end of the housing, plural hinge pin portions 34 extending transverse to the longitudinal axis 35 of the housing which extends between the end portions 37, 38 of the core portion 30. Although the first core housing may comprise other materials, preferably the first core housing 32 comprises a resilient, insulating plastic material.

The second transformer portion 24 comprises, generally, a second U-shaped magnetically permeable core portion 50 which is retained in a second core housing 52 which also, preferably, comprises a resilient, insulating plastic material. To sense current in a conductor, such as the cable 54, the conductor is passed through a central opening 56 formed when the end portions 37, 38 of the first U-shaped core portion 30 are brought into mating contact with the ends 58, 60 of the second U-shaped core portion 50. An alternating current in the conductor will produce an expanding and collapsing magnetic field in the encircling rectangular core portions 30 and 50 which will, in turn, induce an electric current and voltage in the wire of a secondary winding 62 which is wound on a bobbin 64 and encircles the cross-section of one of the legs of the second U-shaped core portion 50. The ratio of the current induced in the secondary winding of the sensing transformer to the current flowing in the conductor is substantially proportional to the ratio of the number of turns in the primary winding to the number of turns in the secondary winding. Although the conductor could be passed through the core multiple times, the conductor is commonly passed through core only once creating a primary winding with a single turn.

While the sensing transformer 20 comprises plural U-shaped transformer cores, a split core transformer could comprise plural C-shaped cores, a combination of a C-shaped core and a U-shaped core or a beam core in combination with a U-shaped core or a C-shaped core or another plurality of cores of one or more shapes which, when brought into contact, could be arranged to encircle a conductor.

To assure contact between the ends 37, 38 of the first core portion 30 and the ends 58, 60 of the second core portion 50 when the transformer portions are pivoted toward each other, the second core portion 50 is urged toward the first core portion by plural springs 68 which bear on the bottom of the horizontal leg of the second U-shaped core portion and on a partition 70 secured within and dividing the first core housing 52. A fulcrum 69 projecting from the interior surface of the first core housing 32 and bearing on the first core portion 30 permits rotation of the first core portion to compensate for dimensional differences at the mating end surfaces of the first and second core portions. In the alternative or in addition, a resilient member could be included between the first core portion and the first core housing to urge the first core portion toward the second core portion. Locating the springs or other resilient member in the second core housing reduces the height of the first core housing making it easier to move the first core housing out of the way when installing a cable in the core aperture.

A circuit board 72 is suspended in a configurable end cap 53 attached to the housing 52 of the second transformer portion 24. The circuit board 72 supports elements of an electronic circuit which is connectable to the secondary winding by conductors 73 which plug into the circuit board. The circuit board and/or the end cap typically supports electrical components, such as one or more capacitors 74 which filter or otherwise condition the output of the secondary winding, trimpots 76 for adjusting for the effect of variations in the characteristics of the circuit's components and plural light emitting diodes (LEDs) 78 to indicate the functioning and/or malfunctioning of the circuitry or the presence/absence of current in the conductor. The end cap is configurable by including different circuits and components to sense the current induced the secondary winding and respond to it in some way. By way of examples only, Cota, U.S. Pat. No. 5,502,374, and Bernklau, U.S. Patent Publication No.: US 2009/0115403, incorporated herein by this reference, include one or more exemplary circuit schematics for, respectively, a current sensor and a low threshold current switch comprising a sensing transformer which might be incorporated in the end cap 53 in the sensing transformer 20. A lead 80 conducts the output of the sensing transformer.

While disconnecting the conductor to be monitored is unnecessary when installing it in the core aperture of a split core sensing transformer, sensing transformers are often installed in small and/or crowded enclosures where there may be insufficient room to open the sections of a hinged split core or where the open hinged core portion may block access to the conductor, a portion of the sensing transformer or other equipment in the enclosure. The portions of some split core transformers are separable facilitating installation of the transformer in spaces which are only a little larger than the space occupied by the assembled transformer but reassembly of the transformer may be difficult, particularly, in a confined or crowded space. The inventor concluded that if the joined portions of a sensing transformer could be rotated relative to each other about two perpendicular axes the available space around the transformer could be utilized more effectively and obstacles could be avoided, facilitating installation of the sensing transformer in crowded or close environments.

The hinge 26 of the split core sensing transformer 20 comprises a hinge ring 90 having features engageable with respective portions of the first core housing 32 and the second core housing 52. The hinge ring 90 comprises a generally cylindrical turret portion wall 92 and a hinge knuckle portion 94. The wall of the turret portion 92 defines a central aperture 96 and a slit 98 extending through the wall. Arrayed around the perimeter of the inner surface 100 of the turret portion's wall are plural arcuate lip segments 102 which project toward the center of the central aperture 96 and normal to the inner surface 100 of the wall. The lip segments 102 are engageable to interlock with a turret ring 104 which is supported above the surface of the first core housing 52 by a concentric, smaller diameter turret ring support 106. The hinge ring 90 preferably comprises a resilient material, such as a plastic, enabling expansion of the turret portion 92 when the hinge ring is pressed over the turret ring 104 and elastic contraction of the turret to interlock the lip segments 102 of the hinge ring with the turret ring.

The hinge knuckle portion 94 of the hinge ring 90 comprises plural C-shaped knuckle segments 108 arranged along a hinge axis 110 which is perpendicular to the central axis 112 of the turret portion 92. The resilient knuckle segments 108 are elastically engageable with hinge pin segments 34 of the first core housing 32. With the hinge ring 90 engaged with the turret ring 104 of the second core housing 52 and with the hinge pin segments 34 of the first core housing 32, the first core portion can be rotated relative to the second core about the hinge axis 110 and the mutually perpendicular central axis 112 of the turret portion.

To gain access to the central aperture of the split core sensing transformer 20 to install a conductor 54 for monitoring, the end of the first transformer portion 22 distal of the hinge 26 can be pivoted about the hinge axis 110, rotated left or right about the turret axis 112 or pivoted in combination with rotation to an open position, such as the exemplary open position designated 22'. Space around the sensing transformer can be utilized more effectively because the first transformer portion need not be pivoted substantially normal to the closed position to gain access to the central portion of the second transformer portion and obstacles on either side of the transformer may be avoided.

When the conductor to be monitored 56 has been placed in the center portion of the U-shaped second transformer portion 24, it can, if desired, be secured with a cable tie 120 wrapped around the conductor and an anchor 122 projecting from the second core housing 52.

When the conductor is in place in the second core portion, the first transformer portion is rotated and pivoted back toward the closed position. Lateral surfaces 124 of a latch tongue 126, cantilevered from the second core housing 52, are tapered toward the center at the end of the latch tongue distal of the living hinge. The lateral surfaces 124 of the latch tongue 126 are arranged to engage inner surfaces of latch bar supports 132 securing the latch bar 36 to the first transformer portion 24 and, in combination with projecting portions 123 of the second housing, rotationally guide the end 38 of the first core portion 30 into contact with the end portion 60 of the second core portion 50 while the ends 37 and 58 of the core portions protrude into the central aperture 96 of the hinge ring 90 and make contact. A front surface 128 of the latch tongue 126 engages the back surface of the latch bar 36 and resiliently bends the latch tongue toward the second transformer core portion 50 as the first transformer portion 22 is rotated about the hinge axis 110 toward the closed position. When the installer presses the first transformer portion 22 into the closed position, the ends 37, 38 of the first core portion 30 contact the respective ends 58, 60 of the second core 50, displacing the second core portion by compressing the springs 68 until a latching surface 134 is urged by the resilience of the cantilevered latch tongue to engage the top surface of the latch bar 36 and secure the transformer portions in the closed position.

The first core housing 32 defines an aperture 142 coaxial with plural apertures 144 defined by the projecting portions 123 of second core housing 52 when the transformer portions are in the closed position. A member 140, for example a portion of a cable tie, can to be inserted through apertures in the core housings to prevent inadvertent pivoting and separation of the transformer portions 22, 24.

The split core sensing transformer with core portions rotatable relative to each other around two perpendicular axes makes utilization of the space around the transformer more effective when installing a conductor in which the current will be monitored.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

We claim:

1. A sensing transformer comprising:
   (a) an elongate first transformer portion including a first core portion and defining a hinge pin;
   (b) a hinge ring comprising a hinge knuckle arranged to secure said hinge pin for rotation about a hinge axis and a cylindrical turret portion having a wall defining an aperture with a central axis substantially normal to said hinge axis and a ledge projecting inward from an inner surface of said wall; and
   (c) a second transformer portion including a second core portion and a circular turret ring interlockingly engageable with said ledge to secure said hinge ring to said first transformer portion for rotation about said central axis of said of turret portion.

2. The sensing transformer of claim 1 further comprising:
   (a) a first latch element affixed to said first transformer portion; and
   (b) a second latch element affixed to said second transformer portion and engageable with said first latch element to align a surface of said second core portion for engagement with a surface of said first core portion and to secure said surfaces against disengagement.

3. The sensing transformer of claim 1 further comprising:
   (a) a first latch element including:
      (i) a latch bar; and
      (ii) a latch support extending substantially normal to latch bar and affixing said latch bar to said first transformer portion; and
   (b) a second latch element resiliently affixed to said second transformer portion and comprising a first tapered surface engageable with said latch support to rotate said first transformer portion about said second axis and urge alignment of a surface of said second core portion with a surface of said first core portion and a second surface urged by said resilience to engage said latch bar when said surface of said second core portion is urged into contact with said surface of said first core portion.

4. A sensing transformer comprising:
   (a) an elongate first transformer portion comprising:
      (i) a first core portion including a first end portion and a second end portion; and
      (ii) a first core housing enclosing a portion of said first core portion and defining a hinge pin arranged substantially normal to a longitudinal axis of said first core housing;
   (b) a hinge ring comprising:
      (i) a hinge knuckle engageable with said hinge pin to secure said hinge pin for rotation about a hinge axis; and
      (ii) a cylindrical turret including a wall defining an aperture with a central axis normal to said hinge axis and a ledge projecting from an inner surface of said wall toward said central axis; and
   (c) a second transformer portion comprising:
      (i) a second core portion having a first end portion arranged for contact with said first end portion of said first core portion and a spaced apart second end portion arranged for contact with said second end portion of said first core portion, said first core portion and said second core portion defining a core aperture when said end portions are in contact; and
      (ii) a second core housing enclosing a portion of a second core portion and defining a turret ring arranged for interlocking, rotatable engagement with said ledge of said hinge ring.

5. The sensing transformer of claim 4 further comprising an anchor portion of said second core housing arranged for securing a conductor in said core aperture.

6. The sensing transformer of claim 4 further comprising:
   (a) a first latch element affixed to said first core housing; and
   (b) a second latch element affixed to said second core housing and engageable with said first latch element to align said first end portion of said second core portion for engagement with said first end portion of said first core portion and to secure said core portions against disengagement of said first end portions.

7. The sensing transformer of claim 6 wherein:
   (a) said first core housing further defines a first core lock aperture extending transverse to said longitudinal axis; and
   (b) said second core housing further defines a second core lock aperture coaxial with said first core lock aperture when said end portions of said first core portion and said second core portions are in contact, said end portions securable against disengagement when in contact by a member inserted in said first core lock aperture and said second core lock aperture.

8. The sensing transformer of claim 4 further comprising a resilient element engageable with said second core portion and said second core housing to urge said end portions of said second core portion into contact with said end portions of said first core portion.

9. The sensing transformer of claim 4 further comprising:
   (a) a first latch element including:
      (i) a latch bar; and
      (ii) a latch support extending substantially normal to latch bar and affixing said latch bar to said first core housing; and (b) a second latch element resiliently affixed to said second core housing and comprising a first tapered surface engageable with said latch support to rotate said second core portion about said second axis and urge alignment of said first end portion of said second core portion with said first end portion of said first core portion and a second surface urged by said resilience to engage said latch bar when said first end portion of said second core portion urged into contact with said first end of said first core portion.

10. The sensing transformer of claim 4 further comprising:
(a) a fulcrum projecting from said first core housing and arranged to contact said first core portion between said first end portion and said second end portion of said first core portion; and
(b) a resilient element supported by said second core housing and arranged to urge at least one of said first end portion and said second end portion of said second core portion toward said first core portion.

\* \* \* \* \*